United States Patent [19]

Ichikawa et al.

[11] 3,948,667

[45] Apr. 6, 1976

[54] PHOTOSENSITIVE COMPOSITIONS

[75] Inventors: Mitsuo Ichikawa, Hachioji; Yasumasa Takeuchi, Yokohama; Takao Miura, Ibaraki; Yoshiyuki Harita; Mitsuru Tashiro, both of Yokohama; Takahiro Tsunoda, Funabashi, all of Japan

[73] Assignee: Japan Synthetic Rubber Company Limited, Tokyo, Japan

[22] Filed: July 1, 1974

[21] Appl. No.: 484,982

Related U.S. Application Data

[63] Continuation of Ser. No. 264,436, June 20, 1972, abandoned.

[30] Foreign Application Priority Data

June 21, 1971 Japan.............................. 46-44731
June 22, 1971 Japan.............................. 46-44991

[52] U.S. Cl................ 96/115 R; 96/35.1; 96/91 N; 204/159.22; 204/159.23
[51] Int. Cl.².......................................... G03C 1/68
[58] Field of Search............ 96/115 R, 115 P, 35.1, 96/91, 91 N; 204/159.22, 159.23

[56] References Cited

UNITED STATES PATENTS

| 2,852,379 | 9/1958 | Hepner............................... 96/91 N |
| 3,201,240 | 8/1965 | Faber................................. 96/115 R |
| 3,278,305 | 10/1966 | Laridon et al..................... 96/115 R |
| 3,467,523 | 9/1969 | Seidel et al........................ 96/91 N |
| 3,502,470 | 3/1970 | Delzenne et al.................. 96/115 R |
| 3,669,662 | 6/1972 | Agnihotri........................... 96/91 N |
| 3,669,669 | 6/1972 | Klein et al......................... 96/115 R |
| 3,674,496 | 7/1972 | Bokou et al....................... 96/91 N |

*Primary Examiner*—Edward C. Kimlin
*Attorney, Agent, or Firm*—Toren, McGeady and Stanger

[57] ABSTRACT

Solvent-developed type photosensitive compositions containing as an essential ingredient at least one selected from the group of the cyclization product of butadiene polymer or copolymer and organic solvent, with or without at least one member selected from the group consisting of photosensitizer and photosensitive crosslinking agent, both soluble in an organic solvent.

12 Claims, No Drawings

PHOTOSENSITIVE COMPOSITIONS

This is a continuation of application Ser. No. 264,436 filed Jun. 20, 1972 now abandoned.

This invention relates to photosensitive compositions. More particularly, the invention relates to solvent-developed type photosensitive compositions which are one of cyclization products of butadiene polymers or copolymers combined or not combined with a photosensitizer soluble in organic solvents and/or a photosensitive crosslinking agent.

The resinous substance obtained by treating natural rubber with sulfuric acid or the like are called "cyclized rubbers," and it is combined with diazide-type photosensitive crosslinking agents to provide photosensitive materials, which are in use as photosensitive resists. From the viewpoint of synthesis technology, there is no difficulty in the least in the cyclization of natural rubber. Ever since 1781 when Leon Hardy first obtained a non-elastic, hard and brittle substance by subjecting natural rubber to the action of sulfuric acid, numerous reports and patents have been published. With butadiene type synthetic rubbers, on the other hand, the gelation that readily occurs has rendered it difficult to form cyclization products, such as "cyclized rubber," which are soluble in organic solvents.

We previously found that 1,2-polybutadiene in the presence of a photosensitizer affords an excellent photosensitive material capable of giving a high precision pattern. In an attempt to improve the 1,2-polybutadiene based photosensitive material, we modified 1,2-polybutadiene through various polymer reactions, and succeeded in synthesizing a cyclization product of 1,2-polybutadiene without attendant gelation. It was found that this cyclization product exhibits greater photosensitivity than the starting material 1,2-polybutadiene.

We further synthesized cyclization products of 1,4-polybutadiene, styrene-butadiene copolymer, 1,4-polyisoprene, 3,4-polyisoprene, etc. Photosensitive properties of these products were compared and the cyclization products of butadiene polymers, particularly polybutadiene, were found to possess by far the greater photosensitivity and excellent image forming ability. The discovery has led to the present invention. The cyclization products of polybutadiene according to this invention are more than ten times as photosensitive as conventional "cyclized rubber."

The photosensitive polymers which are used in the practice of this invention are the cyclization products obtained by cyclizing butadiene polymers and copolymers. There is no special limitation to the microstructure of the butadiene polymers to be used. Namely, polybutadiene or butadiene copolymers, whose microstructures in butadiene units consist mainly of 1,4-cis-, 1,4-trans- or 1,2-structures or mixtures thereof, may be used in this invention. As the butadiene copolymers, copolymers of unsaturated monomers, e.g., vinyl aromatic compounds such as styrene and α-methylstyrene, vinyl cyanide compounds such as acrylonitrile, or ethylenically unsaturated carboxylic acid esters such as acrylates and methacrylates, with butadiene may be used. Even the substances obtained from butadiene monomer directly by cyclization polymerization, not by way of a butadiene polymer, may be included in the scope of the invention provided that such substances are not substantially different from the cyclization products of butadiene polymers. While no specific limit is put to the degree of cyclization, those cyclization products of butadiene polymers or copolymers are cyclized to a range preferably between about 5 and 95 percent, and more preferably between about 10 and 90 percent. The cyclization products according to this invention, which are soluble in organic solvents, are so photosensitive that they readily crosslink even upon exposure to light in a room, the resultant being subsequently converted into substances having little or no solubility in organic solvents. In order to carry our invention more effectively into practice, it is desirable to add photosensitizers and further more effectively, photosensitive crosslinking agents to such photosensitive cyclization products. These photosensitizers and photosensitive crosslinking agents may be used singly or in combination.

The photosensitizers useful for the present invention are those soluble in organic solvents, namely aromatic carbonyl compounds, such as benzophenone, anthraquinone, 1,2-naphthoquinone, 1,4-naphthoquinone, β-methylanthraquinone, benzanthrone, violanthrone, 9-anthraldehyde, benzil, p,p'-tetramethyl diaminobenzophenone, and chloranil; aromatic hydrocarbons, such as anthracene and chrysene; nitro compounds, such as nitrobenzene, p-dinitrobenzene, α-nitronaphthalene, p-nitrodiphenyl, 2-nitrofluorene, and 5-nitroacenaphthene; nitrogen compounds, such as nitroaniline, 2-chloro-4-nitroaniline, 2,6-dichloro-4-nitroaniline, 5-nitro-2-aminotoluene, and tetracyanoethylene; and sulfur compounds, such as diphenyl disulfide. There is no special limitation to the photosensitizers; any photosensitizer which can prove effective when combined with the particular cyclization product of butadiene polymers to be processed in accordance with the present invention may be employed. These photosensitizers may, of course, be used in combination.

Useful photosensitive crosslinking agents which are soluble in organic solvents are not specifically limited but, for example, diazide type photosensitive substances, such as 4,4'-diazidostilbene, p-phenylene bisazide, 4,4'-diazidobenzophenone, 4,4'-diazidodiphenylmethane, 4,4'-diazidocalcon, 2,6-di-(4'-azidobenzal)-cyclohexanone, 2,6-di-(4'-azidobenzal)-4-methylcyclohexanone, 4,4'-diazidodiphenyl, 4,4'-diazido-3,3'-dimethyldiphenyl, and 2,7-diazidofluorene may preferably be used. These photosensitive crosslinking agents may, of course, be used in combination.

Useful organic solvents according to the invention, which are not specifically limited, include aromatic hydrocarbons, such as toluene, xylene and benzene, halogenated hydrocarbons, such as trichloroethylene, perchloroethylene, carbon tetrachloride, tetrachloroethane, chlorobenzene and dichlorobenzene. These solvents may, of course, be used in combination.

Such a photosensitive cyclization product of butadiene polymer or copolymer which is soluble in organic solvents, with or without the addition of the photosensitizer and/or the photosensitive crosslinking agent, is applied on a metal plate of aluminum, zinc, copper or the like, or on a silicon wafter. When the thin film thus formed on the plate or silicon wafer is exposed to ultraviolet rays (UV) or electron rays etc., a crosslinking reaction takes place and converts the film into a substance insoluble in organic solvents. Thus, if the coated surface is exposed to UV or electron rays etc. through a pattern and developed with the organic solvent, a relief image will be formed. The resulting image has high resistance to acids or alkalis and makes the metal surface amenable to etching, electroplating or other metal working treatment.

As described above, the solvent-developed type photosensitive composition of this invention containing cyclization product of butadiene polymer or copolymer as an essential ingredient is so photosensitive, in comparison with conventional photosensitive materials containing "cyclized rubber" or cyclization product of polyisoprene as base polymer, that it may be applied effectively to chemical milling, electroplating, printed circuit and other metal working treatment.

The present invention is illustrated in further detail by the following examples and referential examples.

From a comparison of Examples 1 to 3 and Referential Example 1, it is clear that, in order to obtain the same number of resist steps, the polybutadiene cyclization products require only one-tenth to one-sixtieth of the exposure time that is needed by the polyisoprene cyclization product. In other words, the photochemical-reaction speeds of the former products are 10 to 60 times greater than that of the latter.

Table 1

|  |  | $[\eta]$* | Degree of cyclization (%) | \multicolumn{6}{c}{No. of resist steps (specific sensitivity)} |  |  |  |  |  |
|---|---|---|---|---|---|---|---|---|---|
|  |  |  |  | 10 | 20 | 30 | 60 | 300 | 600 sec.** |
| Example 1*** | Cyclization product of 1,4-cis-polybutadiene | 1.9 | 31 | 0 | 0 | 0 | 0 | + (0.13) | — |
| 2 | " 1,2-polybutadiene | 0.79 | 53 | 7 | 8 | 10 | 12 (22) | 18 (52) | 21 (140) |
| 3 | " 1,4-cis-polybutadiene | 0.66 | 63 | 6 | 8 | 10 | 12 (22) | 16 (26) | 19 (25) |
| 4 | " 1,2-1,4-polybutadiene | — | — | 6 | 8 | 10 | 12 (22) | 17 (36) | 20 (35) |
| 5 | " styrene-butadiene rubber | 0.54 | — | 0 | 2 | 4 | 6 (3) | 11 (4) | 13 (3) |
| Referential Example 1*** | Cyclization product of 1,4-cis-polyisoprene | 0.53 | — | 0 | 0 | 0 | 0 | 0 | 0 |
| 2 | " 1,4-cis-polyisoprene | 0.53 | — | 0 | 0 | 0 | 3 (1.0) | 7 (1.0) | 10 (1.0) |
| 3 | " 3,4-polyisoprene | 0.62 | — | 0 | 0 | 0 | 0 | 2 | 4 |
| 4 | " 1,2-polybutadiene | 2.30 | | | | | | | 1800 19 |
| 5 | " 1,4-Cis-polybutadiene | 2.99 | — | 0 | 0 | 0 | 1 | 5 | 6  16 |
| 6 | " Styrene-butadiene rubber (styrene content 25%) | 2.5 | — | 0 | 0 | 0 | 2 | 8 | 11 |
| 7 | " High-styrene rubber (styrene content 85%) | — | — | 0 | 0 | 0 | 1 | 6 | 8 |
| 8 | " 1,4-Cis-polyisoprene | 5 | — | 0 | 0 | 2 | 4 | 6 | 8 |
| 9 | " Nitrile rubber (nitrile content 35%) | — | — | 0 | 0 | 1 | 2 | 4 | 11 |

*Intrinsic viscosity determined in toluene at 30°C
**Exposure time
***Photosensitizer was not added.

EXAMPLES 1 – 5 AND REFERENTIAL EXAMPLES 1 – 9

One gram of each test sample was dissolved in 80 cc. of toluene and insoluble matter was filtered away. The samples of Example 1 and Referential Example 1 prepared in this way were directly used as photosensitive solutions, while those of Examples 2 and 5 and Referential Examples 2 to 9 were used after the addition of 0.04 g. each of p,p'-tetramethyl diaminobenzophenone. Each of these test solutions was coated on an aluminum plate by a rotary coating method, then was exposed to UV through a photographic step tablet having 21 steps (Eastman Kodak's "Photographic Step Tablet No. 2") by the contact printing method. After the development with toluene the number of steps left behind as insoluble steps (resist steps) was counted as a measure of photosensitivity. The photosensitivity values determined in this manner and the specific sensitivity values (the larger the number of steps the higher the photosensitivity) are compared in Table 1.

Notes:
1. The cyclization products of the polymers were prepared by subjecting a 0.6% toluene solution of each test polymer to the action of a catalyst consisting of diethyl aluminum chloride and trichloroacetic acid.
2. The degree of cyclization of the cyclized polymers was determined from NMR spectra.
3. The numerals in parentheses represent specific sensitivity values as calculated from the formulas given in the Journals, the Technical Association of Graphic Arts of Japan, Vol. 6, No. 11 pp. 65–68 (1963).

EXAMPLES 6 – 8 AND REFERENTIAL EXAMPLES 10 – 17

One gram of each test sample was dissolved in 80 cc. of trichloroethylene, impurities were filtered away, and 0.04 g. of benzanthrone was added. The resulting photosensitive solution was coated on an aluminum plate by a rotary coating method. The film was dried, and then was exposed to UV through the "Photographic Step Tablet No. 2" by contact printing method. After removal of the unexposed parts by trichloroethylene, the number of steps left behind as resist steps was compared with those of other samples. The results and the specific sensitivity values of the test samples are given in Table 2.

It is manifest from a comparison of Examples 5 to 6 and Referential Examples 9 and 10 that, regardless of the type of photosensitizer used, the cyclization products of various polybutadiene have photochemical-reaction speeds 10 to 60 times greater than those of the polyisoprene cyclization products and cyclized rubber.

Table 2

|  | Exposure time | No. of resist steps (specific sensitivity) | | | | | |
|---|---|---|---|---|---|---|---|
|  |  | 10 | 20 | 30 | 60 | 300 | 600 sec. |
| Example 6 | Cyclization product of 1,2-polybutadiene | 8 | 9 | 10 | 12 | 17 (50) | 19 (51) |
| Example 7 | " 1,4-cis-polybutadiene | 5 | 9 | 8 | 12 | 16 (35) | 19 (51) |
| Example 8 | " styrene-butadiene rubber | 0 | 0 | 0 | 2 | 7 (1.4) | 13 (6) |
| Ref.Ex.10 | Cyclization product of 1,4-cis-polyisoprene | 0 | 0 | 0 | 0 | 6 (1.0) | 8 (1.0) |
| Ref.Ex.11 | Cyclized rubber | 0 | 0 | 0 | 0 | 5 (0.7) | 7 (0.7) |
| Ref.Ex.12 | Cyclization product of 3,4-polyisoprene | 0 | 0 | 0 | 1 | 7 (1.4) | 10 (2) |
| Ref.Ex.13 | 1,4-Cis-polybutadiene | 0 | 0 | 4 | 4 | 3 | — |
| Ref.Ex.14 | Styrene-butadiene rubber | 0 | 0 | 0 | 0 | 0 | 3 |
| Ref.Ex.15 | High-styrene rubber | 0 | 0 | 0 | 0 | 3 | 6 |
| Ref.Ex.16 | 1,4-Cis-polyisoprene | 0 | 0 | 0 | 0 | 1 | 5 |
| Ref.Ex.17 | Nitrile rubber | 0 | 0 | 0 | 0 | 2 | 5 |

EXAMPLE 9

In this example the effect of the degree of cyclization of the cyclization product of 1,4-cis-polybutadiene upon the photosensitivity was examined.

In the entirely same manner as described in Example 3, excepting that cyclization products of 1,4-cis-polybutadiene having different degree of cyclization were used, the photosensitivity of the products were compared. The results are summarized in Table 3.

Table 3

| Degree of cyclization (%) | No. of resist steps | |
|---|---|---|
|  | 10 sec. | 30 sec. |
| 20 | 10 | 12 |
| 30 | 6 | 13 |
| 65 | 7 | 9 |
| 70 | 4 | 7 |
| 73 | 4 | 7 |

EXAMPLES 10 – 16 AND REFERENTIAL EXAMPLES 18 – 19

One gram of each test sample was dissolved in 80 cc. of toluene, impurities were filtered away, and 0.04 g. of 2,6-di(4'-azidobenzal)-4-methylcyclohexanone was added to prepare a photosensitive solution. These solutions were processed, and the photosensitivity was determined in the same manner as in Example 1. The comparative results and specific sensitivity values were tabulated in Table 4.

Table 4

|  |  | [η] | Degree of cyclization (%) | No. of resist steps (specific sensitivity) | |
|---|---|---|---|---|---|
|  |  |  |  | 5 sec. | 10 sec. |
| Ex. 10 | Cycln. product of 1,4-cis-polybutadiene | 0.87 | 61 | 13 | 15 (13) |
| Ex. 11 | " | 0.86 | 62 | 13 | 15 (13) |

Table 4-continued

|  |  | [η] | Degree of cyclization (%) | No. of resist steps (specific sensitivity) | |
|---|---|---|---|---|---|
|  |  |  |  | 5 sec. | 10 sec. |
| Ex. 12 | " | 0.90 | 56 | 13 | 15 (13) |
| Ex. 13 | Cycln. product of 1,2-polybutadiene | 0.46 | — | — | 11 (3) |
| Ex. 14 | " | 2.3 | — | — | 17 (26) |
| Ex. 15 | Cycln. product of styrene-butadiene rubber | 0.54 | — | — | 12 (4) |
| Ex. 16 | " | 1.03 | — | — | 15 (13) |
| Ref. Ex. 18 | Cyclized rubber | — | — | 7 | 8 (1.0) |
| Ref. Ex. 19 | Cycln. product of 1,4-cis-polyisoprene | 0.49 | — | — | 11 (3) |

Notes:
1. The cyclization products of the polymers were prepared by subjecting a 0.6% solution of each polymer to the action of a catalyst consisting of diethyl aluminum chloride and trichloroacetic acid.

EXAMPLE 17

A photosensitive material according to this invention prepared by combining a cyclization product of 1,4-cis-polybutadiene (degree of cyclization; 63%) with 2,6-di(4'-azidobenzal)-cyclohexanone was compared with two commercially available photosensitive materials, i.e., Fuji Yakuhin Kogyo Co.'s "FSR" and Eastman Kodak's "KTFR." By the same procedure as followed in Example 1 the unexposed parts were removed by a xylene developer and the number of steps left behind as resists was counted. The results were as follows:

| Photosensitive material | No. of resist steps |
|---|---|
| Cyclization product of 1,4-cis-polybutadiene | 18 |
| "FSR" | 12 |
| "KTFR" | 11 |

This means that the specific sensitivity of the photosensitive material using the cyclization product of 1,4-cis-polybutadiene in accordance with our invention is 8.4 times greater than that of "FSR" or 12 times that of "KTFR."

EXAMPLE 18

The effect of the degree of cyclization of the cyclization product of 1,4-cis-polybutadiene upon the photosensitivity of the resulting photosensitive material was determined in this example.

The same procedure as adopted in Examples 10 to 12 was followed with the exception that cyclization products of 1,4-cis-polybutadiene with different degree of cyclization were used. The photosensitivity values of the test samples compared were as tabulated below.

| Degree of cyclization (%) | No. of resist steps | |
|---|---|---|
| | 10 sec. | 30 sec. |
| 20% | 12 | 16 |
| 30 | 13 | 16 |
| 65 | 15 | 17 |
| 70 | 13 | 18 |
| 73 | 14 | 18 |
| 80 | 11 | 15 |

EXAMPLE 19

One gram of a cyclization product (degree of cyclization; 66%) of 1,4-cis-polybutadiene was dissolved in 100 ml. of xylene and, after removal of impurities by filtration, predetermined amounts of 2,6-di(4'-azidobenzal)-4-methylcyclohexanone (I) and 1,9-benzanthrone (II) were added to the solution. Each of the photosensitive solutions prepared in this way was applied dropwise over an aluminum plate to form a photosensitive film by rotary coating method. The film was dried, and then was exposed to UV for 30 seconds through "Photographic Step Tablet No. 2" by contact printing method. Then the surface was irradiated with ultraviolet rays for 30 seconds. The unexposed parts were removed by a toluene developer, and specific sensitivity was determined. The results were as tabulated below:

| Exp. No. | Photosensitive crosslinking agent (I) | Photo-sensitizer (II) | Specific sensitivity | | |
|---|---|---|---|---|---|
| | | | (I) | (II) | (I)+(II) |
| 1 | 0.03 g | 0 | 13.73 | 0 | — |
| 2 | 0.02 | 0.01 | 9.64 | 0 | 13.73 |
| 3 | 0.01 | 0.02 | 6.46 | 1.00 | 9.64 |
| 4 | 0.005 | 0.025 | 6.46 | 1.00 | 9.64 |
| 5 | 0 | 0.03 | 0 | 1.41 | — |

EXAMPLE 20

The procedure of Example 19 was repeated excepting that a cyclization product of 1,4-cis-polybutadiene with a degree of cyclization of 70% was used and p,p'-dimethylaminobenzophenone was employed instead of 1,9-benzanthrone and that the coated surface was subjected to 10 seconds of UV irradiation. The results were as given in the following table:

| Exp. No. | Photosensitive crosslinking agent (I) | Photo-sensitizer (III) | Specific sensitivity | | |
|---|---|---|---|---|---|
| | | | (I) | (III) | (I)+(III) |
| 6 | 0.005 g | 0.025 g | 7.51 | 1.00 | 10.77 |
| 7 | 0 | 0.03 | 0 | 1.00 | — |

EXAMPLE 21

The procedure of Example 19 was repeated excepting that the cyclization product of 1,4-cis-polybutadiene was replaced by a cyclization product (degree of cyclization; 56%) of rubberlike 1,2-polybutadiene (1,2-, 85%, cis-1,4 15%) and UV irradiation was employed for a period of 10 seconds. The results were as follows:

| Exp. No. | Photosensitive crosslinking agent (I) | Photo-sensitizer (III) | Specific sensitivity | | |
|---|---|---|---|---|---|
| | | | (I) | (III) | (I)+(III) |
| 8 | 0.03 g | 0.00 g | 30.40 | 0 | — |
| 9 | 0.02 | 0.01 | 30.40 | 0 | 43.43 |
| 10 | 0.01 | 0.02 | 30.40 | 1.00 | 43.43 |
| 11 | 0 | 0.03 | 0 | 1.00 | — |

What is claimed is:

1. Solvent-developed type photosensitive compositions comprising at least one member selected from the group consisting of cyclized butadiene polymers and copolymers, an organic solvent, and at least one member selected from the group consisting of photosensitizers and photosensitive crosslinking agents which are soluble in the organic solvent.

2. The photosensitive compositions according to claim 1 wherein the compositions consist essentially of a member selected from the group consisting of cyclized butadiene polymers and copolymers, the organic solvent and a photosensitizer soluble in the organic solvent.

3. The photosensitive compositions according to claim 1 wherein the compositions consist essentially of a member selected from the group consisting of cyclized butadiene polymers and copolymers, the organic solvent and a photosensitive crosslinking agent soluble in the organic solvent.

4. The photosensitive compositions according to claim 1 wherein the compositions consist essentially of a member selected from the group consisting of butadiene polymers and copolymers, the organic solvent, a photosensitizer soluble in the organic solvent and a photosensitive crosslinking agent soluble in the organic solvent.

5. The photosensitive compositions according to claim 1 wherein the butadiene polymer is selected from the group consisting of the polybutadienes whose microstructure consists mainly of 1,4-cis-structure, 1,4-trans-structure, 1,2-structure and mixtures thereof.

6. The photosensitive compositions according to claim 1 wherein the butadiene copolymer is selected from the group consisting of copolymers of butadiene and unsaturated monomers selected from the group consisting of vinyl aromatic compounds, vinyl cyanide compounds and ethylenically unsaturated carboxylic acid esters.

7. The photosensitive compositions according to claim 1 wherein the cyclization product is a substance obtained directly by cyclization polymerization of butadiene.

8. The photosensitive compositions according to claim 1 wherein the photosensitizer is one selected from the group consisting of benzophenone, anthraquinone, 1,2-naphthoquinone, 1,4-naphthoquinone, β-methylanthraquinone, benzanthrone, violanthrone, 9-anthraldehyde, benzil, p,p¹-tetramethyl diaminobenzophenone, and chloranil, anthracene, chrysene, nitrobenzene, p-dinitrobenzene, α-nitronaphthalene, p-nitrodiphenyl, 2-nitrofluorene, 5-nitroacenaphthene, nitroaniline, 2-chloro-4-nitroaniline, 2,6-dichloro-4-nitroaniline, 5-nitro-2-aminotoluene, tetracyanoethylene and diphenyl disulfide.

9. The photosensitive compositions according to claim 1 wherein the photosensitive crosslinking agent is a diazide type photosensitive compound.

10. The photosensitive compositions according to claim 1 wherein the photosensitive crosslinking agent is selected from the group consisting of 4,4'-diazidostilbene, p-phenylene bisazide, 4,4'-diazidobenzophenone, 4,4'-diazidodiphenylmethane, 4,4'-diazidocalcon, 2,6-di-(4'-azidobenzal)-cyclohexanone, 2,6-di-(4'-azidobenzal)-4-methylcyclohexanone, 4,4'-diazidodiphenyl, 4,4'-diazido-3,3'-dimethyldiphenyl, and 2,7-diazidofluorene.

11. The photosensitive compositions according to claim 1 wherein the organic solvent is selected from the group consisting of aromatic hydrocarbons and halogenated hydrocarbons.

12. The photosensitive compositions according to claim 1 wherein the organic solvent is selected from the group consisting of toluene, xylene, ethylbenzene, trichloroethylene, perchloroethylene, carbon tetrachloride, tetrachloroethane, chlorobenzene, and dichlorobenzene.

* * * * *